United States Patent
Yoshimura et al.

(10) Patent No.: US 9,631,140 B2
(45) Date of Patent: Apr. 25, 2017

(54) LIGHT-EMITTING DEVICE

(71) Applicant: Sharp Kabushiki Kaisha, Osaka-shi, Osaka (JP)

(72) Inventors: Kenichi Yoshimura, Osaka (JP); Hiroshi Fukunaga, Osaka (JP); Masamichi Harada, Osaka (JP); Kohsei Takahashi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/760,763

(22) PCT Filed: Dec. 19, 2013

(86) PCT No.: PCT/JP2013/084032
§ 371 (c)(1),
(2) Date: Jul. 14, 2015

(87) PCT Pub. No.: WO2014/115447
PCT Pub. Date: Jul. 31, 2014

(65) Prior Publication Data
US 2015/0357529 A1    Dec. 10, 2015

(30) Foreign Application Priority Data
Jan. 23, 2013  (JP) .................. 2013-009912

(51) Int. Cl.
*H01L 33/00* (2010.01)
*H01L 21/00* (2006.01)
(Continued)

(52) U.S. Cl.
CPC .......... *C09K 11/7734* (2013.01); *C09K 11/02* (2013.01); *C09K 11/0883* (2013.01);
(Continued)

(58) Field of Classification Search
CPC ................... H01L 33/502; H01L 33/56; H01L 2933/0091; H01L 2224/48091; H01L 2224/73265; C09K 11/7734; C09K 11/02
(Continued)

(56) References Cited

U.S. PATENT DOCUMENTS

2005/0227569 A1*  10/2005  Maeda ................ C09K 11/025
                                                        445/25
2006/0145123 A1*  7/2006  Li ...................... C09K 11/7734
                                                        252/301.4 F
(Continued)

FOREIGN PATENT DOCUMENTS

| JP | 2005-255895 A | 9/2005 |
| JP | 2007-116139 A | 5/2007 |
| WO | 2012/011444 A1 | 1/2012 |

OTHER PUBLICATIONS

Official Communication issued in International Patent Application No. PCT/JP2013/084032, mailed on Jan. 21, 2014.
Wiscombe, "Improved Mie Scattering Algorithms," Applied Optics, vol. 19, No. 9, May 1, 1980, pp. 1505-1509.

*Primary Examiner* — Dzung Tran
(74) *Attorney, Agent, or Firm* — Keating & Bennett, LLP

(57) ABSTRACT

In a light-emitting device, a 50%-area average diameter of primary particles of a Eu-activated β SiAlON fluorescent material is 10 μm or more, a scattering probability of scattering materials at a peak wavelength of excitation light emitted from an excitation light source is 0.1 mm$^{-1}$ or more and 0.5 mm$^{-1}$ or less, and the Eu-activated β SiAlON fluorescent material is entrapped inside a transparent member in a dispersed state together with the scattering materials.

7 Claims, 6 Drawing Sheets

(51) Int. Cl.
*C09K 11/77* (2006.01)
*H01L 33/56* (2010.01)
*C09K 11/02* (2006.01)
*H01L 33/50* (2010.01)
*C09K 11/08* (2006.01)

(52) U.S. Cl.
CPC ............ *H01L 33/502* (2013.01); *H01L 33/56* (2013.01); *H01L 2224/48091* (2013.01); *H01L 2224/73265* (2013.01); *H01L 2933/0091* (2013.01)

(58) Field of Classification Search
USPC ........................................ 257/98; 438/29, 27
See application file for complete search history.

(56) References Cited

U.S. PATENT DOCUMENTS

| | | | |
|---|---|---|---|
| 2007/0108896 A1 | 5/2007 | Hirosaki | |
| 2009/0045422 A1 | 2/2009 | Kato et al. | |
| 2010/0025632 A1* | 2/2010 | Fukuda | C04B 35/597 252/301.6 R |
| 2011/0248303 A1* | 10/2011 | Suzuki | C09K 11/7734 257/98 |
| 2012/0043503 A1* | 2/2012 | Li | C09K 11/7734 252/301.4 F |
| 2012/0227569 A1* | 9/2012 | Koks | G10D 13/028 84/413 |
| 2012/0313507 A1 | 12/2012 | Hashimoto et al. | |

* cited by examiner

LIGHT-EMITTING DEVICE

TECHNICAL FIELD

The present invention relates to a light-emitting device.

BACKGROUND ART

In recent years, a light-emitting device in combination of a light-emitting element emitting primary light and a wavelength conversion unit absorbing the primary light and emitting secondary light has quickly become popular as a light-emitting device that has a little power consumption, that is small, and that is able to realize a color reproduction over a wide range with high brightness. Research and development of such a light-emitting device are actively ongoing with intent to improve the device performance.

Here, light in a range from an ultraviolet ray having a relatively long wavelength to blue light is usually employed as the primary light emitted from the light-emitting element. Furthermore, while various types of fluorescent materials suitable for use in light-emitting devices are optionally used in the wavelength conversion unit, fluorescent materials in the form of oxides, for example, are employed in many cases.

Under such a situation, oxynitride fluorescent materials have more recently been proposed which are nitride fluorescent materials capable of being exited by excitation light that is emitted from a semiconductor light-emitting device using a nitride semiconductor, such as GaN. The oxynitride fluorescent materials are thermally and chemically more stable than known fluorescent materials, and exhibit high absorption performance for light having wavelengths from a near-ultraviolet range to a visible range.

Patent Literature (PTL) 1 discloses that, among the oxynitride fluorescent materials, particularly a β SiAlON fluorescent material provides a light emission spectrum in a sharp profile with a peak located in a wavelength range of 500 nm to 550 nm, and takes (x, y) values in ranges of 0≤x≤0.3 and 0.6≤y≤0.83 on the CIE coordinates. PTL 1 further states that the β SiAlON fluorescent material is used in lighting apparatuses and image displays.

PTL 2 states that light emission intensity of a Eu-activated β SiAlON fluorescent material is increased by setting a 50%-area average diameter of primary particles of the Eu-activated β SiAlON fluorescent material to be 5 μm or more, light emission intensity of a light-emitting device using the Eu-activated β SiAlON fluorescent material is increased.

CITATION LIST

Patent Literature

PTL 1: Japanese Unexamined Patent Application Publication No. 2005-255895
PTL 2: International Publication No. 2012/011444

Non Patent Literature

NPL 1: W. J. Wiscombe, "Improved Mie scattering algorithms", Applied Optics, Vol. 19, page 1505, May 1, 1980

SUMMARY OF INVENTION

Technical Problem

However, the inventors have found a new problem as a result of studying the relation between the light emission intensity of the Eu-activated β SiAlON fluorescent material and the luminous efficacy of the light-emitting device using the Eu-activated β SiAlON fluorescent material. More specifically, even when the 50%-area average diameter of the primary particles of the Eu-activated β SiAlON fluorescent material is set to a larger value to increase the light emission intensity of the Eu-activated β SiAlON fluorescent material, the luminous efficacy of the light-emitting device including the relevant fluorescent material is not increased for the reason that, even though the light emission intensity of the Eu-activated β SiAlON fluorescent material itself is increased, efficiency of absorbing excitation light by the Eu-activated β SiAlON fluorescent material is reduced in a state where the relevant fluorescent material is dispersed in a transparent member.

In view of the above-described situation, an object of the present invention is to improve the luminous efficacy of the light-emitting device using the Eu-activated β SiAlON fluorescent material in which the 50%-area average diameter of the primary particles of the Eu-activated β SiAlON fluorescent material is relatively large.

Solution to Problem

The present invention provides a light-emitting device comprising a transparent member; and an excitation light source, a Eu-activated β SiAlON fluorescent material, and scattering materials, these three being disposed in the transparent member, wherein a 50%-area average diameter of primary particles of the Eu-activated β SiAlON fluorescent material is 10 μm or more, a scattering probability of the scattering materials at a peak wavelength of excitation light emitted from the excitation light source is 0.1 $mm^{-1}$ or more and 0.5 $mm^{-1}$ or less, and the Eu-activated β SiAlON fluorescent material is entrapped inside the transparent member in a dispersed state together with the scattering materials. With the features mentioned above, the luminous efficacy of the light-emitting device can be improved even in the case using the Eu-activated β SiAlON fluorescent material having such a large particle diameter that the 50%-area average diameter of the primary particles of the Eu-activated β SiAlON fluorescent material is 10 μm or more.

Advantageous Effects of Invention

According to the present invention, it is possible to improve the luminous efficacy of the light-emitting device using the Eu-activated β SiAlON fluorescent material in which the 50%-area average diameter of the primary particles is relatively large.

DESCRIPTION OF EMBODIMENTS

Figure 1:
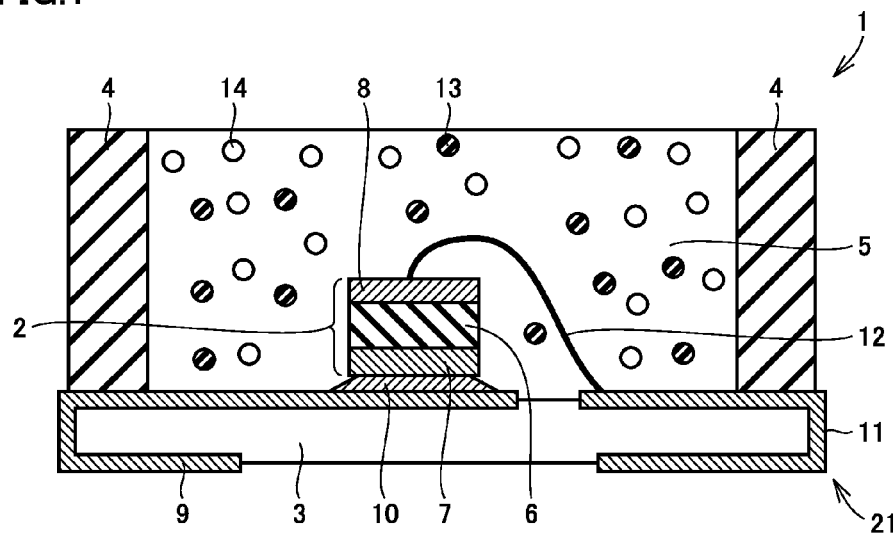
FIG. 1 is a schematic sectional view of a light-emitting device according to an embodiment.

Embodiments of the present invention will be described below. It is to be noted that, in the drawings representing the present invention, the same reference sings denote the same or corresponding components.

FIG. 1 is a schematic sectional view of a light-emitting device according to an embodiment that represents one example of the light-emitting device of the present invention. As illustrated in FIG. 1, a light-emitting device 1 has a structure in which an excitation light source 2, a Eu-activated β SiAlON fluorescent material 13 in the form of individual particles, and scattering materials 14 are included in a transparent member 5. Here, the Eu-activated β SiAlON fluorescent material 13 and the scattering materials 14 are entrapped inside the transparent member 5 in a dispersed state. The transparent member 5, the Eu-activated β SiAlON fluorescent material 13, and the scattering materials 14 constitute a wavelength conversion unit. The transparent member 5 is filled inside a frame 4 that is provided to surround an outer periphery of the surface of a wiring board 21.

The wiring board 21 includes an insulating base 3, an n-type electrode portion 9, and a p-type electrode portion 11, the latter two being disposed on a front surface of the insulating base 3. The n-type electrode portion 9 and the p-type electrode portion 11 are disposed to extend from the front surface of the insulating base 3 to its lateral surfaces and then up to its rear surface. A predetermined spacing is held between the n-type electrode portion 9 and the p-type electrode portion 11 such that both the electrode portions are electrically isolated from each other.

In the embodiment, the excitation light source 2 is made of a nitride semiconductor light-emitting element, and it has a nitride semiconductor multilayer structure 6 in which an active layer made of a nitride semiconductor, such as InGaN, is disposed between an n-type nitride semiconductor layer made of an n-type nitride semiconductor and a p-type nitride semiconductor layer made of a p-type nitride semiconductor. Furthermore, an n-side electrode 7 and a p-side electrode 8 are disposed respectively on the n-type nitride semiconductor layer and the p-type nitride semiconductor layer of the nitride semiconductor multilayer structure 6.

The excitation light source 2 is mounted on the wiring board 21. The n-side electrode 7 of the excitation light source 2 and the n-side electrode 9 on the wiring board 21 are electrically connected to each other by a conductive adhesive 10, and the p-side electrode 8 of the excitation light source 2 and the p-side electrode 11 on the wiring board 21 are electrically connected to each other by a metal wire 12.

In the light-emitting device 1 constituted as described above, excitation light emitted from the excitation light source 2 is absorbed by the Eu-activated β SiAlON fluorescent material 13, and fluorescence is generated from the Eu-activated β SiAlON fluorescent material 13 after being subjected to wavelength conversion therein. As a result, light in a desired color is released from the light-emitting device 1.

In the light-emitting device 1 of the embodiment, the individual particles of the Eu-activated β SiAlON fluorescent material 13 having relatively large particle diameters with a 50%-area average diameter of primary particles being 10 μm or more are entrapped inside the transparent member 5 in the dispersed state together with the scattering materials 14 that have a scattering probability of 0.1 $mm^{-1}$ or more and 0.5 $mm^{-1}$ or less at a peak wavelength of the excitation light emitted from the excitation light source 2. With such a feature, in the light-emitting device 1 of the embodiment, luminous efficacy in the entirety of the light-emitting device 1 can be improved even in the case using the individual particles of the Eu-activated β SiAlON fluorescent material 13 having such relatively large particle diameters that the 50%-area average diameter of the primary particles is 10 μm or more.

The above improvement of the luminous efficacy in the entirety of the light-emitting device 1 has been achieved by the inventors as a result of carrying out intensive studies and finding out the following fact. More specifically, the problem specific to the light-emitting device using the Eu-activated β SiAlON fluorescent material, i.e., the problem that an increase in light emission intensity of the Eu-activated β SiAlON fluorescent material is hard to contribute to increasing light flux emitted from the light-emitting device when the 50%-area average diameter of the primary particles of the Eu-activated β SiAlON fluorescent material is increased with intent to increase light emission intensity of the Eu-activated β SiAlON fluorescent material, can be solved by entrapping the scattering materials 14, which have the scattering probability of 0.1 $mm^{-1}$ or more and 0.5 $mm^{-1}$ or less at the peak wavelength of the excitation light emitted from the excitation light source 2, inside the transparent member 5 in the dispersed state together with the individual particles of the Eu-activated β SiAlON fluorescent material 13 having such relatively large particle diameters that the 50%-area average diameter of the primary particles is 10 μm or more. Thus, the luminous efficacy of the light-emitting device 1 using the Eu-activated β SiAlON fluorescent material 13 can be improved.

The excitation light source 2 is not limited to particular one insofar as the excitation light emitted from the excitation light source 2 is absorbed by the Eu-activated β SiAlON fluorescent material 13 and the fluorescence is generated from the Eu-activated β SiAlON fluorescent material 13. However, a peak wavelength of the excitation light emitted from the excitation light source 2 is preferably 420 nm or longer and 480 nm or shorter and more preferably 440 nm or longer and 470 nm or shorter. When the peak wavelength of the excitation light emitted from the excitation light source 2 is 420 nm or longer and 480 nm or shorter, particularly when it is 440 nm or longer and 470 nm or shorter, the luminous efficacy of the light-emitting device 1 can be further improved.

Materials of the transparent member 5 are at least required to allow at least part of the fluorescence generated from the Eu-activated β SiAlON fluorescent material 13 to transmit therethrough. Of those materials, however, silicone resin is preferably used. When silicone resin is used as the transparent member 5, the light flux capable of being taken out from the light-emitting device 1 is increased, whereby the luminous efficacy of the light-emitting device 1 can be further improved.

A fluorescent material expressed by the following composition formula (I), for example, can be used as the Eu-activated β SiAlON fluorescent material 13. A crystal of the fluorescent material expressed by the following composition formula (I) is a solid solution crystal that is made of, as a mother crystal, an oxynitride or a nitride having the same crystal structure as β $Si_3N_4$, and that is doped with Eu as a light emission center.

$$Si_{6-z}Al_zO_xN_{8-z}:Eu \qquad (I)$$

In the above formula (I), z preferably satisfies a relation of 0<z<4.2. In the above formula (I), Si, Al, O, N and Eu denote silicon, aluminum, oxygen, nitrogen, and europium, respectively, and z is a parameter for representing respective dissolved quantities (atomic number ratios) of atoms constituting the Eu-activated β SiAlON fluorescent material 13.

The 50%-area average diameter of the primary particles of the Eu-activated β SiAlON fluorescent material 13 can be calculated as follows. First, cross-sectional areas of primary particles among the individual particles of the Eu-activated β SiAlON fluorescent material 13 are determined. Here, the cross-sectional areas of the primary particles among the individual particles of the Eu-activated β SiAlON fluorescent material 13 can be calculated by employing the EBSP (Electron Backscatter Diffraction Pattern) method.

In more detail, the individual particles of the Eu-activated β SiAlON fluorescent material 13 are irradiated with an electron beam to cause scattering of electrons, thereby obtaining a pattern of the electron scattering corresponding to the crystal structure and the crystal faces of the Eu-activated β SiAlON fluorescent material 13. Then, a total number N of the primary particles existing in a measurement range of the electron scattering pattern is counted, and a value (S/N) resulting from dividing a total area S of the measurement range of the electron scattering pattern by the total number N of the primary particles existing in the measurement range of the electron scattering pattern is regarded as a cross-sectional area CA of each of the primary particles among the individual particles of the Eu-activated β SiAlON fluorescent material 13 per measurement range.

Then, a particle A1, a particle A2, ..., a particle Ai, and a particle Ak are arrayed successively in ascending order from the primary particle having the smallest cross-sectional area among the individual particles of the Eu-activated β SiAlON fluorescent material 13, and the respective cross-sectional areas CA1, CA2, ..., CAi, ... CAk of the primary particles among the individual particles of the Eu-activated β SiAlON fluorescent material 13 are added successively, thus calculating the sum (CA1+CA2+ ... +CAi+ ... +CAk) of the cross-sectional areas of the primary particles among the individual particles of the Eu-activated β SiAlON fluorescent material 13.

Figure 2:
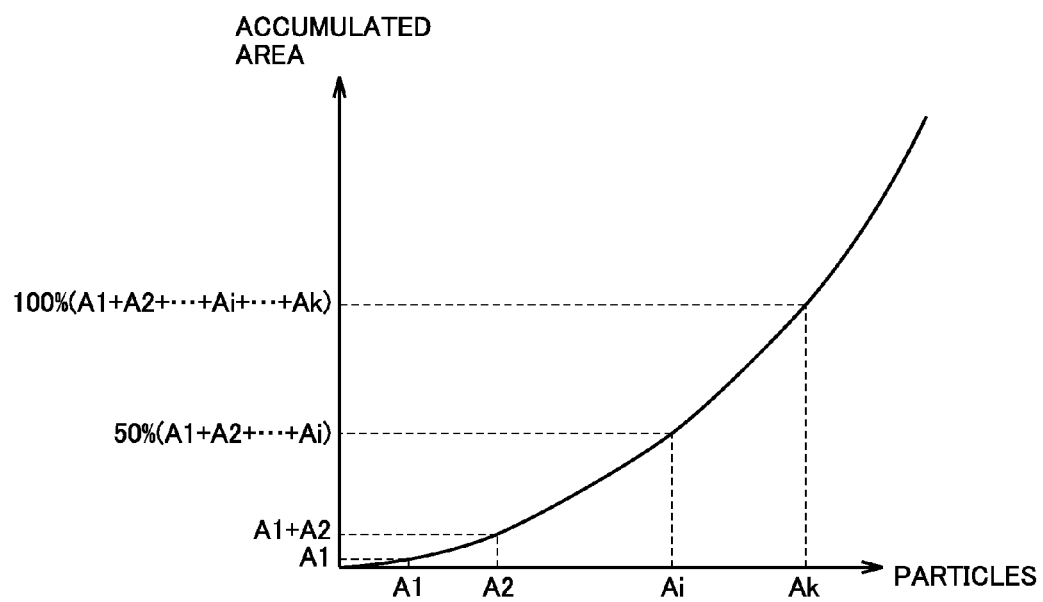
FIG. 2 is one example of a graph used in calculating a 50% average area AS of primary particles of a Eu-activated β SiAlON fluorescent material.

The thus-calculated sum of the cross-sectional areas of all the primary particles among the individual particles of the Eu-activated β SiAlON fluorescent material 13 is assumed to be 100%. As illustrated in FIG. 2, for example, the particles of the Eu-activated β SiAlON fluorescent material 13 are arrayed successively along a horizontal axis in ascending order from the primary particle having the smallest cross-sectional area, and the cross-sectional areas of the primary particles among the individual particles of the Eu-activated β SiAlON fluorescent material 13 are successively accumulated along a vertical axis. The cross-sectional area CAi of the primary particle among the individual particles of the Eu-activated β SiAlON fluorescent material 13 when the sum of cross-sectional areas (i.e., the accumulated area) of the primary particles among the individual particles of the Eu-activated β SiAlON fluorescent material 13 reaches 50% is defined as a 50% average area AS of the primary particles among a total quantity of the Eu-activated β SiAlON fluorescent material 13 contained in the light-emitting device 1.

The 50%-area average diameter of the primary particles among the total quantity of the Eu-activated β SiAlON fluorescent material 13 contained in the light-emitting device 1 is determined by putting, into the following formula (II), the above-obtained 50% average area AS of the primary particles among the total quantity of the Eu-activated β SiAlON fluorescent material 13.

$$\text{50%-area average diameter of the primary particles among the total quantity of the Eu-activated β SiAlON fluorescent material 13 contained in the light-emitting device } 1 = 2 \times (AS/\pi)^{1/2} \qquad (II)$$

Materials of the scattering materials 14 are not limited to particular one insofar as the materials have the scattering probability of 0.1 $mm^{-1}$ or more and 0.5 $mm^{-1}$ or less at the peak wavelength of the excitation light emitted from the excitation light source 2. Of those materials, however, metal oxides are preferably used, and yttrium oxide is more preferably used. When some metal oxide is used as the scattering materials 14, particularly when yttrium oxide is used, the luminous efficacy of the light-emitting device 1 can be further improved.

The scattering probability of the scattering materials 14 is calculated in accordance with the Mie scattering theory discussed, for example, in NPL 1 (W. J. Wiscombe, "Improved Mie scattering algorithms", Applied Optics, Vol. 19, page 1505, May 1, 1980). Parameters necessary for calculating the scattering probability of the scattering materials 14 are the wavelength of the excitation light, the average value of diameters of the scattering materials 14, the refractive index of the scattering materials 14 at the wavelength of the excitation light, the concentration of the scattering materials 14 relative to the transparent member 5, the specific gravity of the scattering materials 14, the refractive index of the transparent member 5 at the wavelength of the excitation light, and the specific gravity of the transparent member 5.

Actual calculation of the scattering probability of the scattering materials 14 can be performed, for example, by employing commercially available software Light Tools (made by CYBERNET SYSTEMS CO., LTD.) or software openly available on the Web (e.g., http://omlc.ogi.edu/calc/mie_calc.html).

The average value of diameters of the scattering materials 14, which is a parameter necessary for calculating the scattering probability of the scattering materials 14, can be calculated by determining an average particle diameter (volume average diameter) of the scattering materials 14 in accordance with the laser-diffraction and scattering method using a particle-size distribution measuring apparatus of laser diffraction type.

The refractive index (absolute refractive index) of the scattering materials 14 is preferably 1.5 or more. When the refractive index of the scattering materials 14 is 1.5 or more, the excitation light emitted from the excitation light source 2 can be effectively scattered by the scattering materials 14 such that the excitation light can be made absorbed by the Eu-activated β SiAlON fluorescent material 13, which is in the state dispersed in the transparent member 5, with high efficiency. Therefore, the luminous efficacy of the light-emitting device 1 can be further improved.

In the light-emitting device 1, while the Eu-activated β SiAlON fluorescent material 13 and the scattering materials 14 are to be entrapped inside the transparent member 5 in the dispersed state, the dispersed state is not required to be a completely dispersed state, and the Eu-activated β SiAlON fluorescent material 13 and the scattering materials 14 may be partly aggregated.

EXAMPLES

Production Example 1 of Fluorescent Material

A Eu-activated β SiAlON fluorescent material expressed by the above composition formula (I), i.e., $Si_{6-z}Al_zO_xN_{8-z}$:Eu, in which Eu was doped to obtain z=0.06 and the Eu dissolved quantity of 0.1 atom %, was prepared as follows.

First, respective predetermined quantities of metal Si powder, aluminum nitride powder, and europium oxide powder, each having passed through a screen having a mesh size of 45 µm, were weighed to obtain a composition of 93.59% by weight of the metal Si powder, 5.02% by weight of the aluminum nitride powder, and 1.39% by weight of the europium oxide powder. Then, those powders were put in an agate mortar and were mixed for 10 minutes or longer with a pestle, whereby a powder aggregate was obtained. The powder aggregate was dropped by gravity into a crucible made of boron nitride and having a diameter of 20 mm and a height of 20 mm.

Next, the crucible including the powder aggregate put therein was set in a pressurized electric furnace of graphite resistance heating type. After evacuating a firing atmosphere into a vacuum state by a diffusion pump, the crucible was heated from a room temperature to 800° C. at a rate of 500° C. per hour. At the time when the temperature of the crucible reached 800° C., nitrogen with purity of 99.999% by volume was introduced to the firing atmosphere and pressure was adjusted to 0.5 MPa. Thereafter, the temperature of the crucible was raised to 1300° C. at a rate of 500° C. per hour, and further raised to 1600° C. at a rate of 1° C. per minute. That temperature was held for 8 hours. A thus-obtained sample was then pulverized into powder by employing an agate mortar, whereby a powdery sample was obtained.

Next, the powdery sample obtained as described above was fired at 1600° C. The powdery sample fired at 1600° C. was pulverized by employing a mortar and a pestle, each made of silicon nitride, and was dropped by gravity into a crucible made of boron nitride and having a diameter of 20 mm and a height of 20 mm.

Next, the crucible including the powdery sample after being fired was set in a pressurized electric furnace of graphite resistance heating type. After evacuating a firing atmosphere into a vacuum state by a diffusion pump, the crucible was heated from a room temperature to 800° C. at a rate of 500° C. per hour. At the time when temperature reached 800° C., nitrogen with purity of 99.999% by volume was introduced to the firing atmosphere and pressure was adjusted to 1 MPa. Thereafter, the temperature of the crucible was raised to 2000° C. at a rate of 500° C. per hour, and that temperature was then held for 10 hours, whereby a fluorescent-material precursor sample was obtained.

Next, 3 g of the fluorescent-material precursor sample obtained as described above was filled in a crucible made of BN and having an inner diameter of 20 mm and a depth of 20 mm, and was subjected to heat treatment in an Ar atmosphere under the atmospheric pressure at 1500° C. for 8 hours by employing a tubular furnace. The powder after the above heat treatment was washed for 1 hour using a mixed solution prepared by mixing hydrofluoric acid in concentration of 50% and nitric acid in concentration of 70% at a volume ratio of 1:1 on condition that temperature of the mixed solution was kept at 80° C. As a result, the Eu-activated β SiAlON fluorescent material of PRODUCTION EXAMPLE 1 was obtained.

Next, the Eu-activated β SiAlON fluorescent material of PRODUCTION EXAMPLE 1 was examined with an X-ray diffraction apparatus, made by Rigaku Corporation, using a K-α line of Cu. As a result, production of β SiAlON was confirmed.

Figure 3:
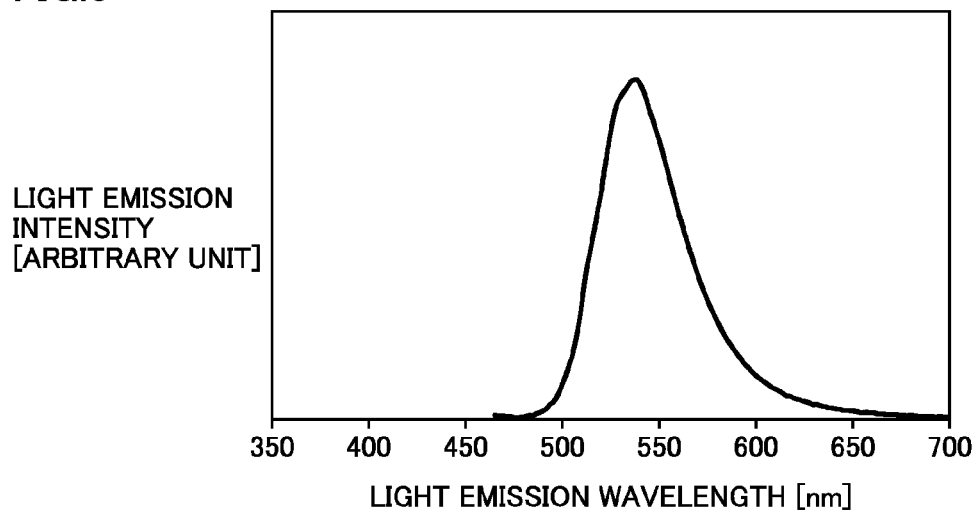
FIG. 3 is a light emission spectrum of Eu-activated β SiAlON fluorescent material powder of PRODUCTION EXAMPLE 1.

Furthermore, the Eu-activated β SiAlON fluorescent material of PRODUCTION EXAMPLE 1 was close-packed into a quartz cell having a width of 10 mm×a length of 10 mm×a depth of 50 mm with tapping, and a light emission spectrum was measured by employing a fluorescence spectrophotometer (Fluoromax 4 made by HORIBA, Ltd.) when the Eu-activated β SiAlON fluorescent material was excited by light having a wavelength of 450 nm. As a result, a light emission spectrum depicted in FIG. 3 was obtained for the Eu-activated β SiAlON fluorescent material of PRODUCTION EXAMPLE 1, and an excitation spectrum depicted in FIG. 4 was obtained by plotting the light emission intensity of the light emission spectrum, depicted in FIG. 3, with respect to the excitation wavelength.

Besides, the 50%-area average diameter of primary particles of the Eu-activated β SiAlON fluorescent material of PRODUCTION EXAMPLE 1, obtained as described above, was calculated by employing the above formula (II) in accordance with the EBSP method. The calculated result was 5 µm.

Production Example 2 of Fluorescent Material

A Eu-activated β SiAlON fluorescent material of PRODUCTION EXAMPLE 2 was obtained by dispersing the Eu-activated β SiAlON fluorescent material of PRODUCTION EXAMPLE 1 in distilled water, and then removing particles of the Eu-activated β SiAlON fluorescent, which had relatively small particle diameters, by employing a nylon mesh with mesh openings of 10 µm.

A light emission spectrum of the Eu-activated β SiAlON fluorescent material of PRODUCTION EXAMPLE 2 was obtained in accordance with the same method under the same conditions as those in the case of the Eu-activated β SiAlON fluorescent material of PRODUCTION EXAMPLE 1. As a result, the peak intensity of light emission of the Eu-activated β SiAlON fluorescent material of PRODUCTION EXAMPLE 2 was 103% of that of the Eu-activated β SiAlON fluorescent material of PRODUCTION EXAMPLE 1, and it was increased from the peak intensity of light emission of the Eu-activated β SiAlON fluorescent material of PRODUCTION EXAMPLE 1.

Besides, the 50%-area average diameter of primary particles of the Eu-activated β SiAlON fluorescent material of PRODUCTION EXAMPLE 2 was calculated in the same manner as that in the case of the Eu-activated β SiAlON fluorescent material of PRODUCTION EXAMPLE 1. The calculated result was 11 µm.

Production Example 1 of Wavelength Conversion Unit

A wavelength conversion unit of PRODUCTION EXAMPLE 1 was fabricated by mixing the Eu-activated β SiAlON fluorescent material of PRODUCTION EXAMPLE 1 at a proportion of 10% by weight into silicone resin (KER-2500 made by Shin-Etsu Chemical Co., Ltd.), pouring the mixture into a mold made of fluorine resin and having a depth of 1 mm and a diameter of 10 mm, heating the mixture at 80° C. for 30 minutes and then at 150° C. for 1 hour, and taking out a molded product from the mold.

Figure 5:
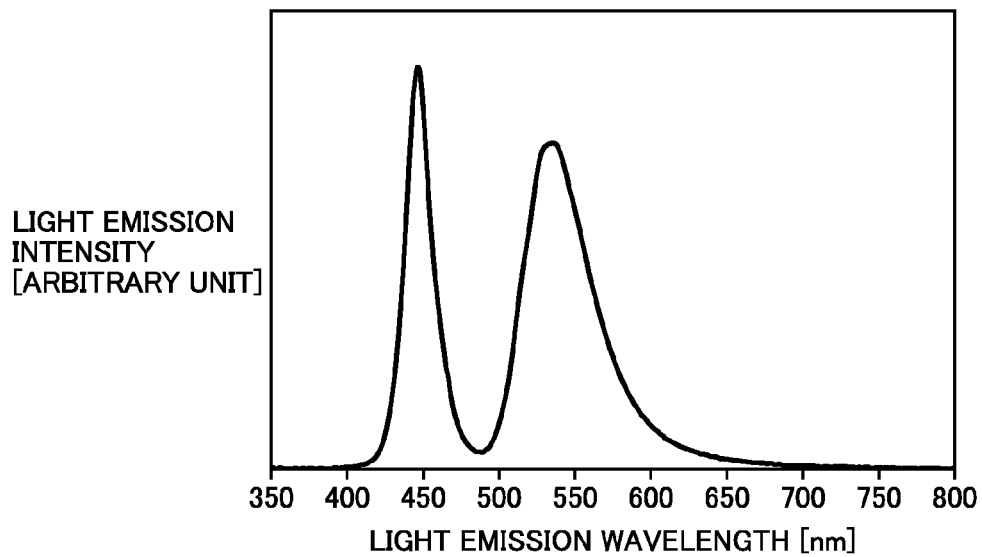
FIG. 5 is a light emission spectrum of a wavelength conversion unit of PRODUCTION EXAMPLE 1.

FIG. 5 is a light emission spectrum when the wavelength conversion unit of PRODUCTION EXAMPLE 1, fabricated as described above, was excited by excitation light emitted from a blue LED (Light Emitting Diode) formed of a nitride semiconductor light-emitting element.

The light emission spectrum plotted in FIG. 5 was measured by setting, in an integrating sphere having an inner diameter of 30 cmϕ and connected to a spectrophotometer (MCPD-2000 made by OTSUKA ELECTRONICS Co., Ltd.), the wavelength conversion unit of PRODUCTION EXAMPLE 1 on a light outgoing surface of the above-mentioned blue LED with the excitation light having a peak wavelength of 450 nm, and then measuring the light emission spectrum by operating the blue LED at a drive current of 20 mA and a drive voltage of 3.2 V.

Production Example 2 of
Wavelength Conversion Unit

A wavelength conversion unit of PRODUCTION EXAMPLE 2 was fabricated in the same manner as that in the case of the wavelength conversion unit of PRODUCTION EXAMPLE 1 except for using the Eu-activated β SiAlON fluorescent material of PRODUCTION EXAMPLE 2 instead of the Eu-activated β SiAlON fluorescent material of PRODUCTION EXAMPLE 1.

Then, a light emission spectrum of the wavelength conversion unit of PRODUCTION EXAMPLE 2 was measured in the same manner under the same conditions as those in the case of the wavelength conversion unit of PRODUCTION EXAMPLE 1. The measured result is plotted in FIG. 6.

Production Example 3 of
Wavelength Conversion Unit

A wavelength conversion unit of PRODUCTION EXAMPLE 3 was fabricated in the same manner as that in the case of the wavelength conversion unit of PRODUCTION EXAMPLE 1 except for using the Eu-activated β SiAlON fluorescent material of PRODUCTION EXAMPLE 2 instead of the Eu-activated β SiAlON fluorescent material of PRODUCTION EXAMPLE 1 and setting, to 11.2% by weight, a mixing rate of the Eu-activated β SiAlON fluorescent material of PRODUCTION EXAMPLE 2 relative to the silicone resin (KER-2500 made by Shin-Etsu Chemical Co., Ltd.).

Then, a light emission spectrum of the wavelength conversion unit of PRODUCTION EXAMPLE 3 was measured in the same manner under the same conditions as those in the case of the wavelength conversion unit of PRODUCTION EXAMPLE 1. The measured result is plotted in FIG. 7.

<Evaluation of Wavelength Conversion Units>

Figure 6:
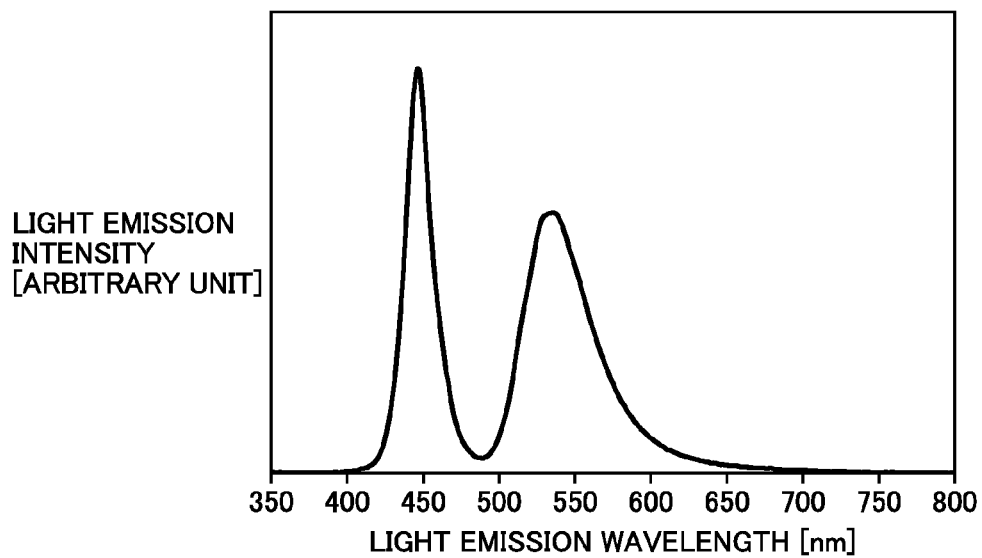
FIG. 6 is a light emission spectrum of a wavelength conversion unit of PRODUCTION EXAMPLE 2.
Figure 7:
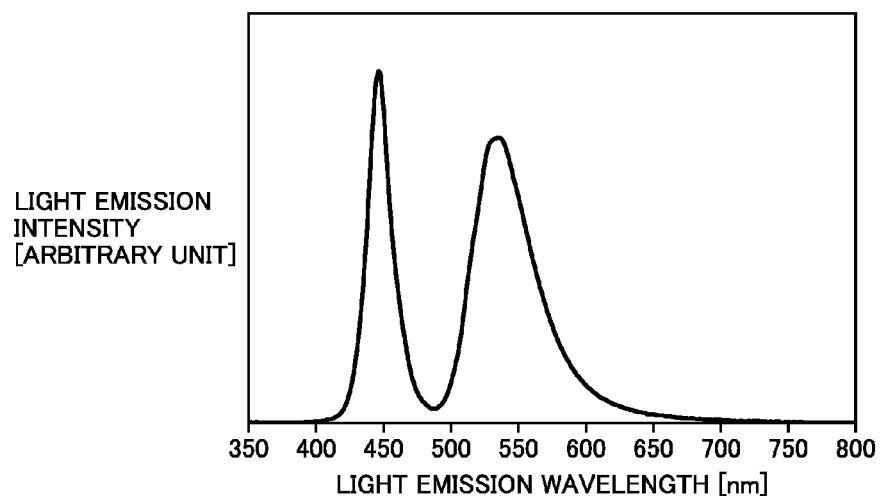
FIG. 7 is a light emission spectrum of a wavelength conversion unit of PRODUCTION EXAMPLE 3.

Characteristics of the wavelength conversion units of PRODUCTION EXAMPLES 1 to 3 were evaluated on the basis of the light emission spectra of FIGS. 5 to 7 by employing the software associated with the measuring apparatus for the light emission spectrum. The evaluated results are listed in Table 1.

TABLE 1

| | Eu-Activated β SiAlON Fluorescent Material | | | | | |
|---|---|---|---|---|---|---|
| Wavelength Conversion Unit | Type | Peak Intensity of Light Emission | Concentration of Fluorescent Material Relative to Silicone Resin | Chromaticity Point CIEx | CIEy | Relative Value of Light Flux |
| PRODUCTION EXAMPLE 1 | PRODUCTION EXAMPLE 1 | 100% | 10% by weight | 0.241 | 0.372 | 100 |
| PRODUCTION EXAMPLE 2 | PRODUCTION EXAMPLE 2 | 103% | 10% by weight | 0.232 | 0.336 | 93.8 |
| PRODUCTION EXAMPLE 3 | PRODUCTION EXAMPLE 2 | 103% | 11.2% by weight | 0.241 | 0.372 | 97.8 |

As seen from Table 1, it has been confirmed that, assuming the light flux emitted from the wavelength conversion unit of PRODUCTION EXAMPLE 1 fabricated using the Eu-activated β SiAlON fluorescent material of PRODUCTION EXAMPLE 1 to be 100, relative values of the light fluxes emitted from the wavelength conversion units of PRODUCTION EXAMPLES 2 and 3, each fabricated using the Eu-activated β SiAlON fluorescent material of PRODUCTION EXAMPLE 2, are less than 100, and that the light flux capable of being taken out to the outside of the wavelength conversion unit is reduced in the wavelength conversion units of PRODUCTION EXAMPLES 2 and 3.

The above point is also apparent from the fact that, comparing the wavelength conversion unit of PRODUCTION EXAMPLE 1 and the wavelength conversion unit of PRODUCTION EXAMPLE 2, values of CIEx and CIEy are smaller in the wavelength conversion unit of PRODUCTION EXAMPLE 2 than in the wavelength conversion unit of PRODUCTION EXAMPLE 1 as indicated in Table 1. Stated in another way, in the wavelength conversion unit of PRODUCTION EXAMPLE 2, the peak intensity of light emission at a wavelength of 450 nm attributable to transmitted light of the excitation light is larger and the peak intensity of light emission at a wavelength of 540 nm attributable to fluorescence of the Eu-activated β SiAlON fluorescent material is smaller than those in the wavelength conversion unit of PRODUCTION EXAMPLE 1.

It is hence understood that, when the wavelength conversion units are fabricated by mixing the Eu-activated β SiAlON fluorescent material into the silicone resin at the same weight proportion, the Eu-activated β SiAlON fluorescent material of PRODUCTION EXAMPLE 2 exhibits lower absorbance of the excitation light than the Eu-activated β SiAlON fluorescent material of PRODUCTION EXAMPLE 1.

Next, comparing the wavelength conversion unit of PRODUCTION EXAMPLE 1 and the wavelength conversion unit of PRODUCTION EXAMPLE 3, there is no difference between them in terms of the chromaticity point indicated in Table 1, but the relative value of the light flux is lower in the wavelength conversion unit of PRODUCTION EXAMPLE 3.

In other words, in the wavelength conversion unit of PRODUCTION EXAMPLE 3 fabricated using the Eu-activated β SiAlON fluorescent material of PRODUCTION EXAMPLE 2, the relative value of the emission light flux is lower than that in the wavelength conversion unit of PRODUCTION EXAMPLE 1 fabricated using the Eu-activated β SiAlON fluorescent material of PRODUCTION EXAMPLE 1 even when the weight proportion of the Eu-activated β SiAlON fluorescent material relative to the silicone resin is adjusted such that the wavelength conversion unit of PRODUCTION EXAMPLE 3 exhibits the same chromaticity point as that in the wavelength conversion unit of PRODUCTION EXAMPLE 1 when the fluorescent material is excited by employing the above-mentioned blue LED as the excitation light source. Such a result is attributable to the fact that, in the wavelength conversion unit of PRODUCTION EXAMPLE 3, the Eu-activated β SiAlON fluorescent material is dispersed in a larger quantity than in the wavelength conversion unit of PRODUCTION EXAMPLE 1, and hence influences of undesired scattering and absorbance by the Eu-activated β SiAlON fluorescent material are increased.

As seen from the results indicated in Table 1, the Eu-activated β SiAlON fluorescent material of PRODUCTION EXAMPLE 2 exhibits larger peak intensity of light emission as the fluorescent material than the Eu-activated β SiAlON fluorescent material of PRODUCTION EXAMPLE 1. However, it is also seen, as described above, that when the wavelength conversion unit is constituted by dispersing the Eu-activated β SiAlON fluorescent material of PRODUCTION EXAMPLE 2 in the silicone resin and the fluorescent material is excited by the excitation light emitted from the above-mentioned blue LED, a larger quantity of light flux is obtained with the light emitted from the wavelength conversion unit of PRODUCTION EXAMPLE 1 fabricated using the Eu-activated β SiAlON fluorescent material of PRODUCTION EXAMPLE 1.

As understood from the above-mentioned results, the Eu-activated β SiAlON fluorescent material has the problem that an increase in the peak intensity of light emission of the Eu-activated β SiAlON fluorescent material is hard to contribute to increasing the light flux of the excitation light emitted from the blue LED even when the peak intensity of light emission of the fluorescent material is increased by setting the 50%-area average diameter of the primary particles of the Eu-activated β SiAlON fluorescent material to a larger value.

Figure 4:
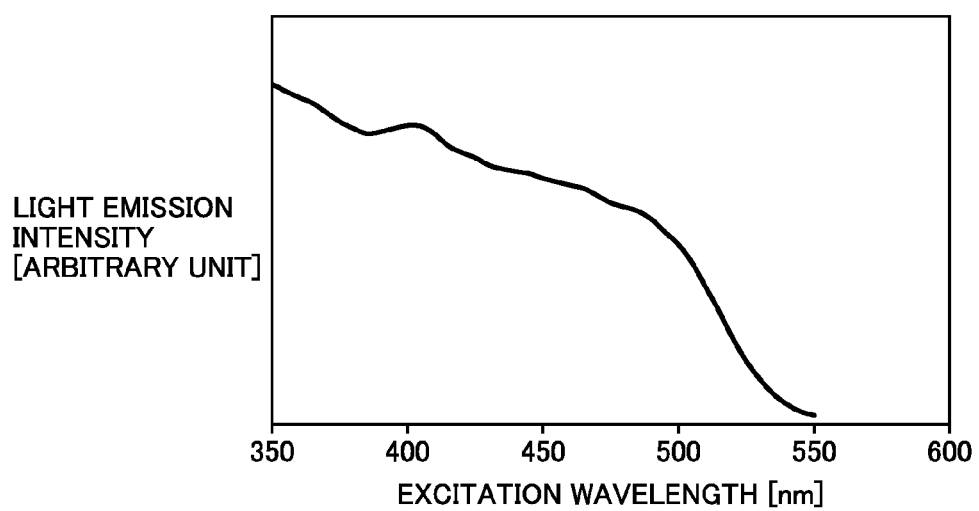
FIG. 4 is an excitation spectrum of the Eu-activated β SiAlON fluorescent material powder of PRODUCTION EXAMPLE 1.

The above-mentioned specific problem is caused by the reason that, as plotted in FIG. 4, the Eu-activated β SiAlON fluorescent material exhibits higher excitation efficiency with light in a near-ultraviolet region at the wavelength of about 350 nm than with blue light at the wavelength of about 450 nm, and it has relatively low excitation efficiency as a practical fluorescent material when excited by the blue light.

As a result of conducting studies to increase the peak intensity of light emission of the Eu-activated β SiAlON fluorescent material and repeating trial production of light-emitting devices in the process of practicing the Eu-activated β SiAlON fluorescent material as a green fluorescent material for a white LED, the inventors have found a novel problem with the case of dispersing the Eu-activated β SiAlON fluorescent material in the transparent member, and have discovered a solution to the novel problem.

More specifically, in the light-emitting device of the present invention, when the Eu-activated β SiAlON fluorescent material is dispersed in the transparent member 5 and is used in combination with the excitation light source made of a semiconductor light-emitting device that emits blue light, a light-emitting device using the Eu-activated β SiAlON fluorescent material can be realized with higher luminous efficacy than those of the related-art devices by entrapping the Eu-activated β SiAlON fluorescent material inside the transparent member in a dispersed state together with scattering materials that have a scattering probability of 0.1 mm$^{-1}$ or more and 0.5 mm$^{-1}$ or less at a peak wavelength of excitation light emitted from the excitation light source.

Practical structural examples of the light-emitting device are described below in which the Eu-activated β SiAlON fluorescent material is entrapped inside the transparent member in the dispersed state together with the scattering materials having the scattering probability of 0.1 mm$^{-1}$ or more and 0.5 mm$^{-1}$ or less at the peak wavelength of the excitation light emitted from the excitation light source, which is made of the semiconductor light-emitting device.

COMPARATIVE EXAMPLE 1

Figure 12:
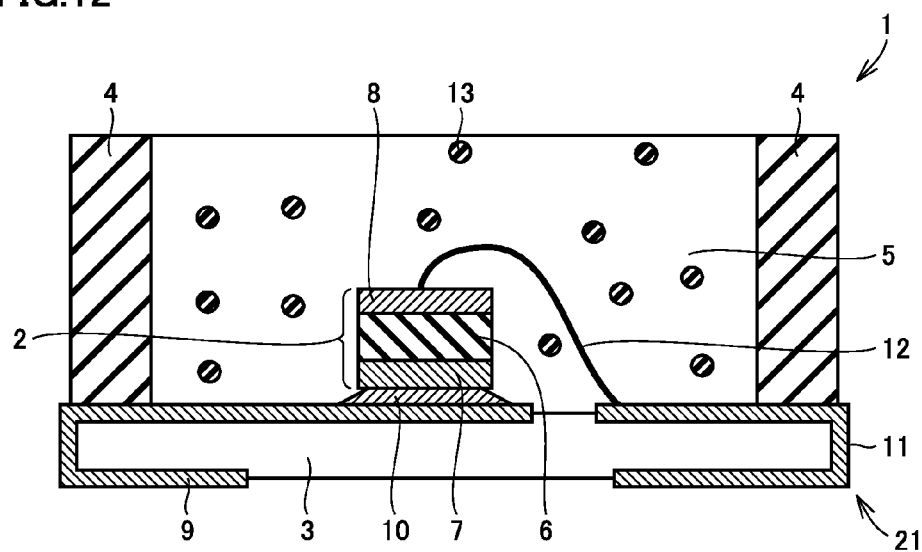
FIG. 12 is a schematic sectional view of a light-emitting device of COMPARATIVE EXAMPLE 1.

As illustrated in a schematic sectional view of FIG. 12, a light-emitting device of COMPARATIVE EXAMPLE 1 was fabricated by removing the scattering materials 14 from the above-described light-emitting device, and by setting the weight proportion of the Eu-activated β SiAlON fluorescent material 13 relative to the silicone resin, constituting the transparent member 5, to 6.3% by weight.

Furthermore, in the light-emitting device of COMPARATIVE EXAMPLE 1, a semiconductor light-emitting element serving as the excitation light source 2 had an InGaN layer as an active layer in the nitride semiconductor multilayer structure 6 including the n-side electrode 7 and the p-side electrode 8 disposed on both sides of the InGaN layer, and it emitted light having a peak wavelength of 450 nm.

Moreover, in the light-emitting device of COMPARATIVE EXAMPLE 1, the Eu-activated β SiAlON fluorescent material of PRODUCTION EXAMPLE 2 was used as the Eu-activated β SiAlON fluorescent material 13, and the commercially available silicone resin (KER-2500 made by Shin-Etsu Chemical Co., Ltd.) having the refractive index of 1.42 and the specific gravity of 1 was used as the transparent member 5. In the light-emitting device of COMPARATIVE EXAMPLE 1, as mentioned above, the scattering materials 14 are not contained in the transparent member 5 made of the silicone resin, and the Eu-activated β SiAlON fluorescent material of PRODUCTION EXAMPLE 2 was dispersed in the transparent member at the proportion of 6.3% by weight relative to the silicone resin.

EXAMPLE 1

A light-emitting device of EXAMPLE 1 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 5.9% by weight.

In the light-emitting device of EXAMPLE 1, the scattering materials 14 were entrapped inside the silicone resin such that the weight proportion of the scattering materials 14 relative to the silicone resin was 0.05% by weight. Besides, Y$_2$O$_3$ particles (made by JAPAN PURE CHEMICAL CO., LTD.) having an average particle diameter of 2 μm, a refractive index of 1.8, and scattering efficiency of 0.19 mm$^{-1}$ for the light at the wavelength of 450 nm was used as the scattering materials 14.

EXAMPLE 2

A light-emitting device of EXAMPLE 2 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 5.9% by weight.

In the light-emitting device of EXAMPLE 2, the scattering materials 14 were entrapped inside the silicone resin such that the weight proportion of the scattering materials 14 relative to the silicone resin was 0.1% by weight. Besides, Y$_2$O$_3$ particles (made by JAPAN PURE CHEMICAL CO., LTD.) having an average particle diameter of 2 μm, a refractive index of 1.8, and scattering efficiency of 0.38 mm$^{-1}$ for the light at the wavelength of 450 nm was used as the scattering materials 14.

EXAMPLE 3

A light-emitting device of EXAMPLE 3 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 6.2% by weight.

In the light-emitting device of EXAMPLE 3, the scattering materials 14 were entrapped inside the silicone resin such that the weight proportion of the scattering materials 14 relative to the silicone resin was 0.1% by weight. Besides, Y$_2$O$_3$ particles (made by JAPAN PURE CHEMICAL CO., LTD.) having an average particle diameter of 3.9 μm, a refractive index of 1.8, and scattering efficiency of 0.19 mm$^{-1}$ for the light at the wavelength of 450 nm was used as the scattering materials 14.

COMPARATIVE EXAMPLE 2

A light-emitting device of COMPARATIVE EXAMPLE 2 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 5.2% by weight.

In the light-emitting device of COMPARATIVE EXAMPLE 2, the scattering materials 14 were entrapped inside the silicone resin such that the weight proportion of the scattering materials 14 relative to the silicone resin was 0.26% by weight. Besides, Y$_2$O$_3$ particles (made by JAPAN PURE CHEMICAL CO., LTD.) having an average particle diameter of 2 μm, a refractive index of 1.8, and scattering efficiency of 0.99 mm$^{-1}$ for the light at the wavelength of 450 nm was used as the scattering materials 14.

COMPARATIVE EXAMPLE 3

A light-emitting device of COMPARATIVE EXAMPLE 3 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 5% by weight.

In the light-emitting device of COMPARATIVE EXAMPLE 3, the scattering materials 14 were entrapped inside the silicone resin such that the weight proportion of the scattering materials 14 relative to the silicone resin was 0.42% by weight. Besides, Y$_2$O$_3$ particles (made by JAPAN PURE CHEMICAL CO., LTD.) having an average particle diameter of 2 μm, a refractive index of 1.8, and scattering efficiency of 1.58 mm$^{-1}$ for the light at the wavelength of 450 nm was used as the scattering materials 14.

COMPARATIVE EXAMPLE 4

A light-emitting device of COMPARATIVE EXAMPLE 4 was fabricated in the same manner as that in COMPARATIVE EXAMPLE 1 except for entrapping the scattering materials 14 inside the silicone resin serving as the transparent member 5, as illustrated in FIG. 1.

In the light-emitting device of COMPARATIVE EXAMPLE 4, the scattering materials 14 were entrapped inside the silicone resin such that the weight proportion of the scattering materials 14 relative to the silicone resin was 0.1% by weight. Besides, Y$_2$O$_3$ particles (made by JAPAN PURE CHEMICAL CO., LTD.) having an average particle diameter of 9.7 μm, a refractive index of 1.8, and scattering efficiency of 0.06 mm$^{-1}$ for the light at the wavelength of 450 nm was used as the scattering materials 14.

COMPARATIVE EXAMPLE 5

A light-emitting device of COMPARATIVE EXAMPLE 5 was fabricated in the same manner as that in COMPARATIVE EXAMPLE 1 except for entrapping the scattering materials 14 inside the silicone resin serving as the transparent member 5, as illustrated in FIG. 1, and setting the weight proportion of the Eu-activated β SiAlON fluorescent material of PRODUCTION EXAMPLE 2 relative to the silicone resin to 5.6% by weight.

In the light-emitting device of COMPARATIVE EXAMPLE 5, the scattering materials 14 were entrapped inside the silicone resin such that the weight proportion of the scattering materials 14 relative to the silicone resin was 1% by weight. Besides, Y$_2$O$_3$ particles (made by JAPAN PURE CHEMICAL CO., LTD.) having an average particle diameter of 9.7 μm, a refractive index of 1.8, and scattering efficiency of 0.63 mm$^{-1}$ for the light at the wavelength of 450 nm was used as the scattering materials 14.

COMPARATIVE EXAMPLE 6

A light-emitting device of COMPARATIVE EXAMPLE 6 was fabricated in the same manner as that in COMPARATIVE EXAMPLE 1 except for using the Eu-activated β SiAlON fluorescent material of PRODUCTION EXAMPLE 1 instead of the Eu-activated β SiAlON fluorescent material of PRODUCTION EXAMPLE 2, and setting the weight proportion of the Eu-activated β SiAlON fluorescent material of PRODUCTION EXAMPLE 1 relative to the silicone resin to 5.8% by weight.

<Others>

In the light-emitting devices of EXAMPLES 1 to 3 and COMPARATIVE EXAMPLES 2 to 5 described above, the concentration of the Eu-activated β SiAlON fluorescent material of PRODUCTION EXAMPLE 2 relative to the silicone resin was adjusted such that the chromaticity point calculated from a light emission spectrum obtained by each of the light-emitting devices of EXAMPLES 1 to 3 and COMPARATIVE EXAMPLES 2 to 5 was positioned near the chromaticity point in the light-emitting device of COMPARATIVE EXAMPLE 1.

Figure 8:
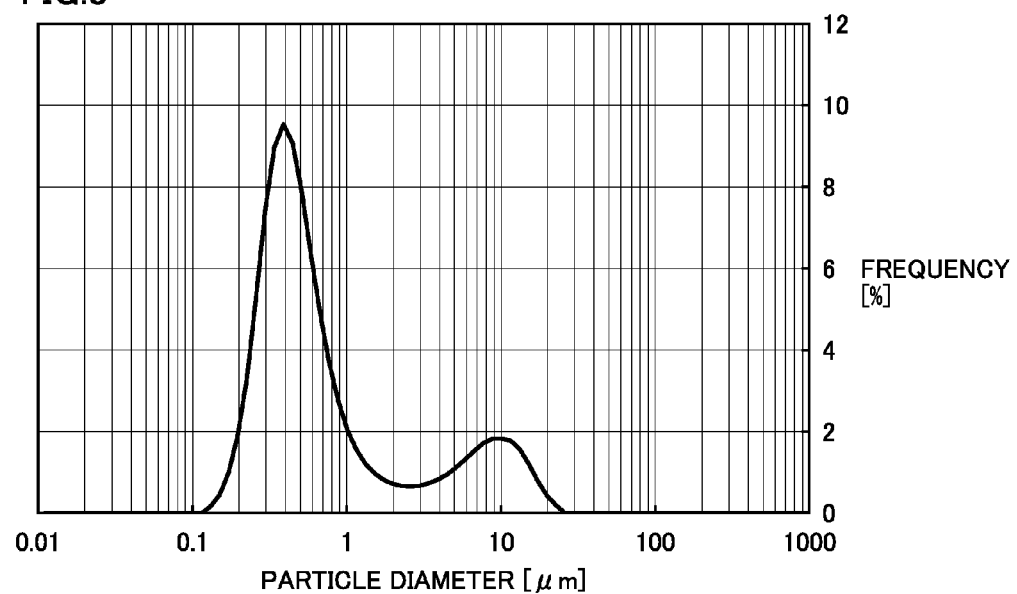
FIG. 8 plots a particle size distribution of $Y_2O_3$ particles having an average particle diameter of 2 μm.
Figure 9:
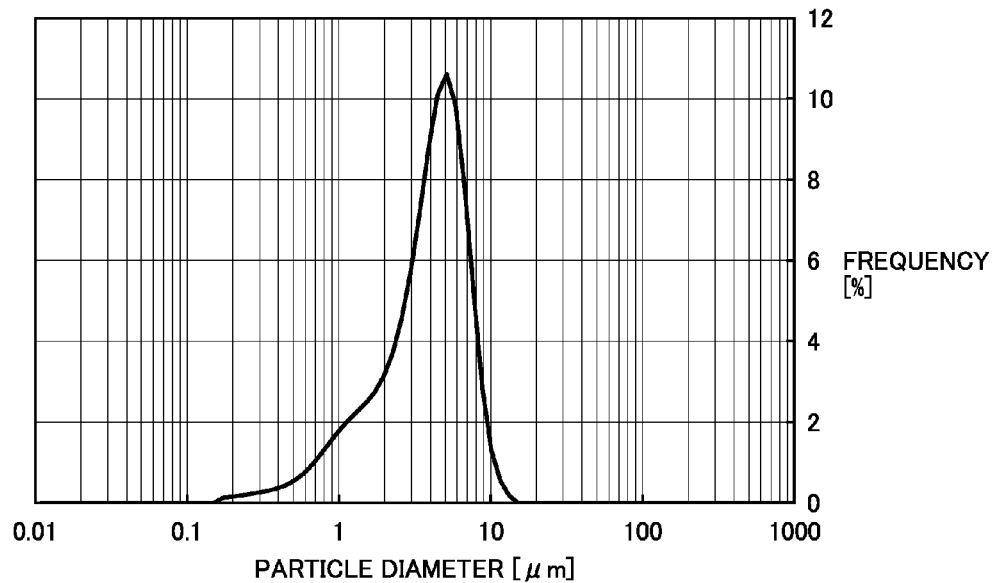
FIG. 9 plots a particle size distribution of $Y_2O_3$ particles having an average particle diameter of 3.9 μm.
Figure 10:
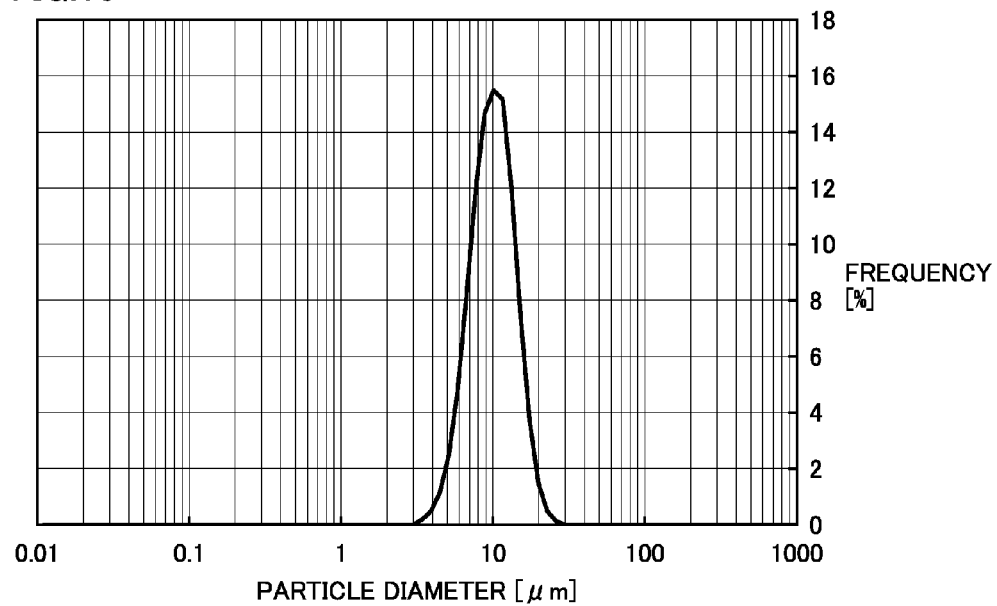
FIG. 10 plots a particle size distribution of $Y_2O_3$ particles having an average particle diameter of 9 μm.

Particle diameters of the $Y_2O_3$ particles used in the light-emitting devices of EXAMPLES 1 to 3 and COMPARATIVE EXAMPLES 2 to 5 were adjusted by employing a nylon-made screen, and an average particle diameter of the $Y_2O_3$ particles was measured by employing a particle-size distribution measuring apparatus of laser diffraction type (LA-950 made by HORIBA, Ltd.), and by running the software associated with the measuring apparatus. FIG. 8 plots a particle size distribution of the $Y_2O_3$ particles having the average particle diameter of 2 μm, FIG. 9 plots a particle size distribution of the $Y_2O_3$ particles having the average particle diameter of 3.9 μm, and FIG. 10 plots a particle size distribution of the $Y_2O_3$ particles having the average particle diameter of 9 μm.

Furthermore, a value of the refractive index (absolute refractive index) of the $Y_2O_3$ particles was defined by quoting the value described in the literature, and the scattering probability of the $Y_2O_3$ particles was calculated by employing software that was prepared by the inventors with reference to NPL 1.

<Evaluation>

Figure 11:
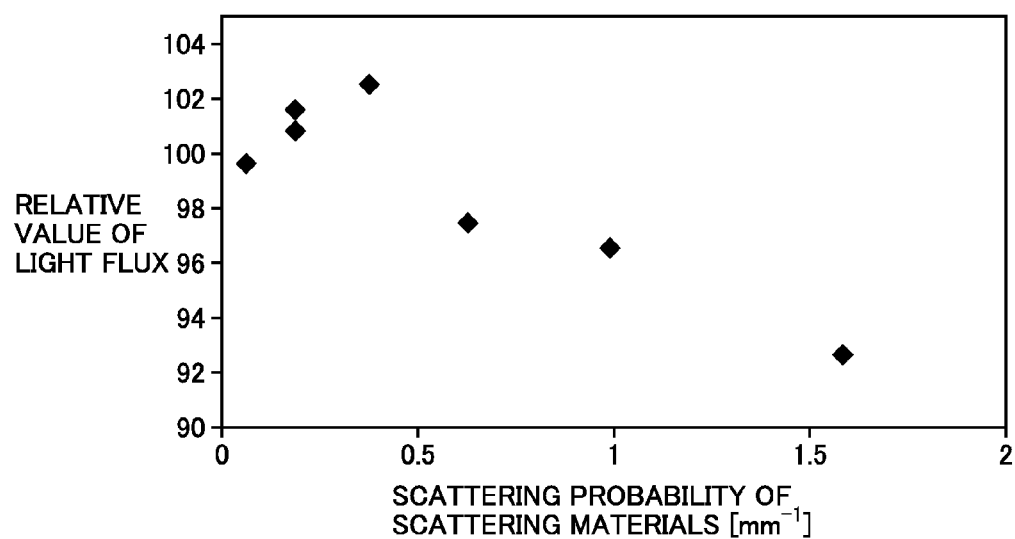
FIG. 11 plots the relation between a scattering probability of scattering materials in a light-emitting device for each of EXAMPLES 1 to 3 and COMPARATIVE EXAMPLES 2 to 5 and a relative value of light flux in the light-emitting device.

The chromaticity point (expressed by CIEx and CIEy) and the relative value of the light flux in each of the light-emitting devices of EXAMPLES 1 to 3 and COMPARATIVE EXAMPLES 2 to 6, fabricated as described above, were measured. The measured results are listed in Table 2. Besides, FIG. 11 plots the relation between the scattering probability of the scattering materials in the light-emitting device for each of EXAMPLES 1 to 3 and COMPARATIVE EXAMPLES 2 to 5 and the relative value of the light flux in the relevant light-emitting device. It is to be noted that the relative value of the light flux represents a relative value when the light flux in the light-emitting device of COMPARATIVE EXAMPLE 6 is assumed to be 100.

As seen from Table 2 and FIG. 11, it has been confirmed that, in the light-emitting devices of EXAMPLES 1 to 3, the light flux is increased in comparison with that in the light-emitting devices of COMPARATIVE EXAMPLES 2 to 6. This means that the problem specific to the Eu-activated β SiAlON fluorescent material, i.e., the problem that an increase in light emission intensity of the Eu-activated β SiAlON fluorescent material is hard to contribute to increasing the light flux emitted from the light-emitting device when the 50%-area average diameter of the primary particles of the Eu-activated β SiAlON fluorescent material is increased, has been solved by adding the scattering materials that have a proper scattering probability.

<Recapitulation>

According to the present invention, there is provided a light-emitting device comprising a transparent member; and an excitation light source, a Eu-activated β SiAlON fluorescent material, and scattering materials, these three being disposed in the transparent member, wherein a 50%-area average diameter of primary particles of the Eu-activated β SiAlON fluorescent material is 10 μm or more, a scattering probability of the scattering materials at a peak wavelength of excitation light emitted from the excitation light source is 0.1 $mm^{-1}$ or more and 0.5 $mm^{-1}$ or less, and the Eu-activated β SiAlON fluorescent material is entrapped inside the transparent member in a dispersed state together with the scattering materials. With the features mentioned above, the luminous efficacy of the light-emitting device can be improved even in the case using the Eu-activated β SiAlON fluorescent material having such a large particle diameter that the 50%-area average diameter of the primary particles of the Eu-activated β SiAlON fluorescent material is 10 μm or more.

In the light-emitting device according to the present invention, preferably, the peak wavelength of the excitation light is 420 nm or longer and 480 nm or shorter. With that feature, the luminous efficacy of the light-emitting device can be further improved.

In the light-emitting device according to the present invention, preferably, the transparent member is silicone resin. With that feature, the light flux capable of being taken

TABLE 2

| Light-Emitting Device | Eu-Activated β SiAlON Fluorescent Material | | | Scattering Materials | | Chromaticity Point | | Relative Value of Light Flux |
|---|---|---|---|---|---|---|---|---|
| | Type | Concentration of Fluorescent Material Relative to Silicone Resin (% by weight) | Average Particle Diameter (μm) | Concentration of Scattering Materials Relative to Silicone Resin (% by weight) | Scattering Probability at Peak Wavelength of Excitation Light ($mm^{-1}$) | CIEx | CIEy | |
| COMPARATIVE EXAMPLE 1 | PRODUCTION EXAMPLE 2 | 6.3 | None | None | None | 0.195 | 0.187 | 98.0 |
| EXAMPLE 1 | PRODUCTION EXAMPLE 2 | 5.9 | 2 | 0.05 | 0.19 | 0.195 | 0.186 | 100.8 |
| EXAMPLE 2 | PRODUCTION EXAMPLE 2 | 5.9 | 2 | 0.1 | 0.38 | 0.196 | 0.188 | 102.5 |
| EXAMPLE 3 | PRODUCTION EXAMPLE 2 | 6.2 | 3.9 | 0.1 | 0.19 | 0.194 | 0.186 | 101.6 |
| COMPARATIVE EXAMPLE 2 | PRODUCTION EXAMPLE 2 | 5.2 | 2 | 0.26 | 0.99 | 0.195 | 0.187 | 96.6 |
| COMPARATIVE EXAMPLE 3 | PRODUCTION EXAMPLE 2 | 5.0 | 2 | 0.42 | 1.58 | 0.196 | 0.188 | 92.7 |
| COMPARATIVE EXAMPLE 4 | PRODUCTION EXAMPLE 2 | 6.3 | 9.7 | 0.1 | 0.06 | 0.195 | 0.187 | 99.6 |
| COMPARATIVE EXAMPLE 5 | PRODUCTION EXAMPLE 2 | 5.6 | 9.7 | 1 | 0.63 | 0.195 | 0186 | 97.5 |
| COMPARATIVE EXAMPLE 6 | PRODUCTION EXAMPLE 1 | 5.8 | None | None | None | 0.195 | 0.187 | 100.0 | out from the light-emitting device can be increased, and the luminous efficacy of the light-emitting device can be further improved.

In the light-emitting device according to the present invention, preferably, the scattering materials are metal oxides. With that feature, the luminous efficacy of the light-emitting device can be further improved.

In the light-emitting device according to the present invention, preferably, a refractive index of the scattering materials is 1.5 or more. With that feature, the excitation light emitted from the excitation light source can be efficiently scattered by the scattering materials, and the excitation light can be made absorbed by the Eu-activated β SiAlON fluorescent material, which is in the state dispersed in the transparent member, with high efficiency. Therefore, the luminous efficacy of the light-emitting device can be further improved.

While the embodiments and EXAMPLES of the present invention have been described above, it is also envisioned from the beginning to optionally combine the features of the above-described embodiments and EXAMPLES with each other.

The embodiments and EXAMPLES disclosed here are to be considered in all respects as illustrative and not restrictive. The scope of the present invention is defined by Claims, not by the above description, and the present invention is intended to involve all modifications having meanings and falling within scopes, which are regarded as equivalent to those of Claims.

INDUSTRIAL APPLICABILITY

The present invention can be utilized in light-emitting devices. In particular, the present invention can be suitably utilized in lighting apparatuses, image displays, and so on.

REFERENCE SIGNS LIST

1 light-emitting device, 2 excitation light source, 3 insulating base, 4 frame, 5 transparent member, 6 nitride semiconductor multilayer structure, 7 n-side electrode, 8 p-side electrode, 9 n-type electrode portion, 10 conductive adhesive, 11 p-type electrode portion, 12 metal wire, 13 Eu-activated β SiAlON fluorescent material, 14 scattering material, and 21 wiring board.

The invention claimed is:

1. A light-emitting device comprising a transparent member; and
   an excitation light source, a Eu-activated β SiAlON fluorescent material, and scattering materials, these three being disposed in the transparent member,
   wherein a 50%-area average diameter of primary particles of the Eu-activated β SiAlON fluorescent material is 10 μm or more,
   a scattering probability of the scattering materials at a peak wavelength of excitation light emitted from the excitation light source is 0.1 $mm^{-1}$ or more and 0.5 $mm^{-1}$ or less, and
   the Eu-activated β SiAlON fluorescent material is entrapped inside the transparent member in a dispersed state together with the scattering materials.

2. The light-emitting device according to claim 1, wherein the peak wavelength of the excitation light is 420 nm or longer and 480 nm or shorter.

3. The light-emitting device according to claim 1, wherein the transparent member is silicone resin.

4. The light-emitting device according to claim 1, wherein the scattering materials are metal oxides.

5. The light-emitting device according to claim 1, wherein a refractive index of the scattering materials is 1.5 or more.

6. The light-emitting device according to claim 1, wherein a ratio of the Eu-activated β SiAlON fluorescent material to the transparent member is in a range of 5.9 wt % to 6.2 wt %, and a ratio of the scattering materials to the transparent member is in a range of 0.05 wt % to 0.1 wt %.

7. The light-emitting device according to claim 1, wherein a refractive index of the scattering materials is 1.5 or more and less than 1.6.

* * * * *